US009204036B2

(12) United States Patent
Bahm et al.

(10) Patent No.: US 9,204,036 B2
(45) Date of Patent: Dec. 1, 2015

(54) IMAGE-ENHANCING SPOTLIGHT MODE FOR DIGITAL MICROSCOPY

(71) Applicant: FEI Company, Hillsboro, OR (US)

(72) Inventors: Alan Bahm, Hillsboro, OR (US); N. William Parker, Hillsboro, OR (US); Mark W. Utlaut, Scappoose, OR (US)

(73) Assignee: FEI Company, Hillsboro, OR (US)

( * ) Notice: Subject to any disclaimer, the term of this patent is extended or adjusted under 35 U.S.C. 154(b) by 379 days.

(21) Appl. No.: 13/745,100

(22) Filed: Jan. 18, 2013

(65) Prior Publication Data

US 2013/0307960 A1 Nov. 21, 2013

Related U.S. Application Data

(60) Provisional application No. 61/593,297, filed on Jan. 31, 2012.

(51) Int. Cl.
| | |
|---|---|
| *H04N 7/18* | (2006.01) |
| *H04N 5/232* | (2006.01) |
| *G02B 21/36* | (2006.01) |
| *H04N 1/62* | (2006.01) |
| *H01J 37/26* | (2006.01) |

(52) U.S. Cl.
CPC .......... *H04N 5/23216* (2013.01); *G02B 21/365* (2013.01); *H01J 37/265* (2013.01); *H04N 1/62* (2013.01); *H01J 2237/22* (2013.01); *H01J 2237/28* (2013.01)

(58) Field of Classification Search
CPC ...... G02B 21/365; G02B 21/367; H04N 7/18; H01J 37/28; H01J 37/224
USPC ............................................. 348/79, 80, 576
See application file for complete search history.

(56) References Cited

U.S. PATENT DOCUMENTS

| | | | | |
|---|---|---|---|---|
| 5,977,948 | A | * | 11/1999 | Nishibori ...................... 715/841 |
| 6,889,113 | B2 | | 5/2005 | Tasker et al. |
| 7,308,334 | B2 | | 12/2007 | Tasker et al. |
| 7,664,566 | B2 | | 2/2010 | Tasker et al. |
| 2004/0150648 | A1 | * | 8/2004 | Kim et al. ...................... 345/581 |
| 2006/0210129 | A1 | | 9/2006 | Trendelenburg et al. |

(Continued)

OTHER PUBLICATIONS

Celebi, M. Emre, et al., "Contrast enhancement in dermoscopy images by maximizing a histogram bimodality measure," Proceedings of the IEEE International Conference on Image Processing, 2009, 4 pgs.

(Continued)

*Primary Examiner* — Michael Lee
(74) *Attorney, Agent, or Firm* — Scheinberg & Associates, PC; Michael O. Scheinberg

(57) ABSTRACT

An apparatus to permit a viewer of a digital microscopy original image to manipulate the display and/or the microscope to obtain an enhanced view of a region of interest within the original image. In one preferred embodiment a spotlight mode matches the gray shade scale for a spotlight region-of-interest to the pixel intensity variation present in the spotlight region. The gray shade scale used for the spotlight mode may then be generalized to the original image. In a preferred embodiment, spotlight mode provides an easy mechanism for permitting a user to command a re-imaging of a selected spotlight region from a displayed image. Such re-imaging may permit the use of imaging parameter selections that better fit the spotlight region.

24 Claims, 17 Drawing Sheets

(56) References Cited

U.S. PATENT DOCUMENTS

2008/0144954 A1* 6/2008 Chien et al. .................. 382/254
2010/0128961 A1 5/2010 Kalusche

OTHER PUBLICATIONS

Unknown, "Dexis Imaging Software—Overview," http://www.dexis.com/index.php?option=content&task=view&id=219, retrieved Apr. 9, 2013, 2 pgs.

Unknown, "Dexis: Quick Reference Guide," 4 pgs.

Unknown, "Image Diagnost," http://www.imagediagnost.de/english/cadmethoden.en.html#3, retrieved Apr. 9, 2013, 6 pgs.

Dodgson, Neil A., et al., 'Contrast brushes: interactive image enhancement by direct manipulation,' Computational Aesthetics in Graphics, Visualization, and Imaging, 2009, 8 pgs.

Rorden, Chris, 'Software Manual MRIcro 1.40,' www.cabiatl.com/mricro/mricro.htm, Dec. 31, 2005, 16 pgs.

* cited by examiner

IMAGE-ENHANCING SPOTLIGHT MODE FOR DIGITAL MICROSCOPY

This Application claims priority from U.S. Prov. App. 61/593,297, filed Jan. 31, 2012, which is hereby incorporated by reference.

TECHNICAL FIELD OF THE INVENTION

The present invention relates to the display of images made up of digital pixels and more particularly to the display of images created through digital microscopy.

BACKGROUND OF THE INVENTION

A digital microscope, whether a scanning electron microscope (SEM), transmission electron microscope (TEM), a scanning transmission electron microscope (STEM), a small dual beam microscope (SDB), focused ion beam microscope (FIB) or a light microscope (LM) produce and display a set of digital pixels. Such a digital pixel set typically contains far more data than a human viewer can perceive. The display gray scale, for example, must accommodate all digital pixel values in the image, and therefore displays regions of lower contrast in a manner that may appear to the viewer as an undistinguished field of gray, thereby preventing a human viewer from distinguishing features.

In many types of images, such as biological images, fields of low intensity (dim) pixels, corresponding to soft tissue, are interspersed with high intensity (bright) pixels, corresponding for example, to bones. The same phenomenon occurs in images of integrated circuits, gathered for example, by a focused ion beam (FIB) device, with some surfaces providing a low intensity field of pixels. As noted, the gray shade scale used must be large enough to encompass all the pixel intensities in the image. But this larger scale may show similar intensity pixels as having the same gray shade, or gray shades so similar that the variation is not apparent to a human viewer.

In addition, for assemblies in which an imaging device feeds a display screen, there are frequently instances in which the imaging device could gather more information on a region-of-interest within an area being displayed, if there was a simple way for a user to indicate a region for which more data should be gathered. For example, a scanning device, such as a scanning electron microscope (SEM) may be able to use a narrower beam and a tighter scan pattern or a decreased scan rate or increased sampling rate, to yield more pixels per unit area. For the larger region of the original image, the greater number of pixels yielded by these techniques would be more than could be practically used in the provided display space. In addition, the imaging device can tune its sampling gray-shade scale and range of focus differently, for a smaller region, within the image, thereby bringing greater detail and clarity to that region. But it appears that there is currently no easy way for a user to take advantage of these capabilities, within the context of the larger original image.

Image Diagnost International, at its website http://www.imagediagnost.de/english/, shows a mammography image display having a moveable and size adjustable spotlight that matches the gray shade scale to the gray shades in a spotlight region. In similar measure, Dexis Digital Diagnostic Imaging, having a website at http://www.dexis.com, shows a system having a spotlight that provides gray-shade enhanced imagery over a spotlight area.

U.S. Pat. No. 6,889,113, assigned to the assignee of the present application, discloses an image display assembly in which the user may control the display device or the image forming device or both, by dragging and dropping a shape, originated in a separate program, onto the image. There appears to be no disclosure, however, of spotlight image enhancement for improved viewing by a person.

A proposed method of image enhancement, to facilitate the examination of moles on a human patient's skin, was presented in "Contrast Enhancement in Dermoscopy Images by Maximizing a Histogram Bimodality Measure", by Celebi et al., Proceedings of the IEEE International Conference on Image Processing (ICIP 2009). The method enhances the imagery by choosing an RGB to gray scale conversion weighting scheme that maximizes the bimodality of a histogram of pixel intensity for the resultant image. This increases the efficiency of an automated threshold algorithm, for detecting problematic moles.

Thus there is a need for a user-friendly mechanism for more fully exploiting collected image data for a region of interest within a larger image, and for commanding re-imaging of such a region of interest, to gather a more complete data set for the region.

SUMMARY

An object of the invention is to permit a viewer of a digital microscopy original image to manipulate the display and/or the microscope to obtain an enhanced view of a region of interest within the original image. In one preferred embodiment a spotlight mode matches the gray shade scale for a spotlight region-of-interest to the pixel intensity variation present in the spotlight region. The gray shade scale used for the spotlight mode may then be generalized to the original image, thereby showing details of features similar to those in the spotlight region. The spotlight mode can also be used to highlight several regions in spotlight, to show the spotlight region in reverse contrast, to display data concerning the spotlighted region (for example, a histogram of pixel intensity), to make measurements of image features, and to recognize a pattern in the spotlight region and then search for the pattern elsewhere in the image.

In a preferred embodiment, spotlight mode provides an easy mechanism for permitting a user to command a re-imaging of a selected spotlight region from a displayed image. Such re-imaging may permit the use of a finer beam (for a scanning microscope), a finer pixel sampling rate (measured as samples per unit of scan), an analog-to-digital pre-amp gain adjusted to better fit the pixel intensities present in the displayed image spotlight region and a range of focus set to the highest (nearest range) point in the spotlight region of the imaged matter, which may be lower than the highest point in the region of the displayed image.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more thorough understanding of the present invention, and advantages thereof, reference is now made to the following descriptions taken in conjunction with the accompanying drawings, in which.

DETAILED DESCRIPTION OF THE PREFERRED EMBODIMENTS

Figure 1:
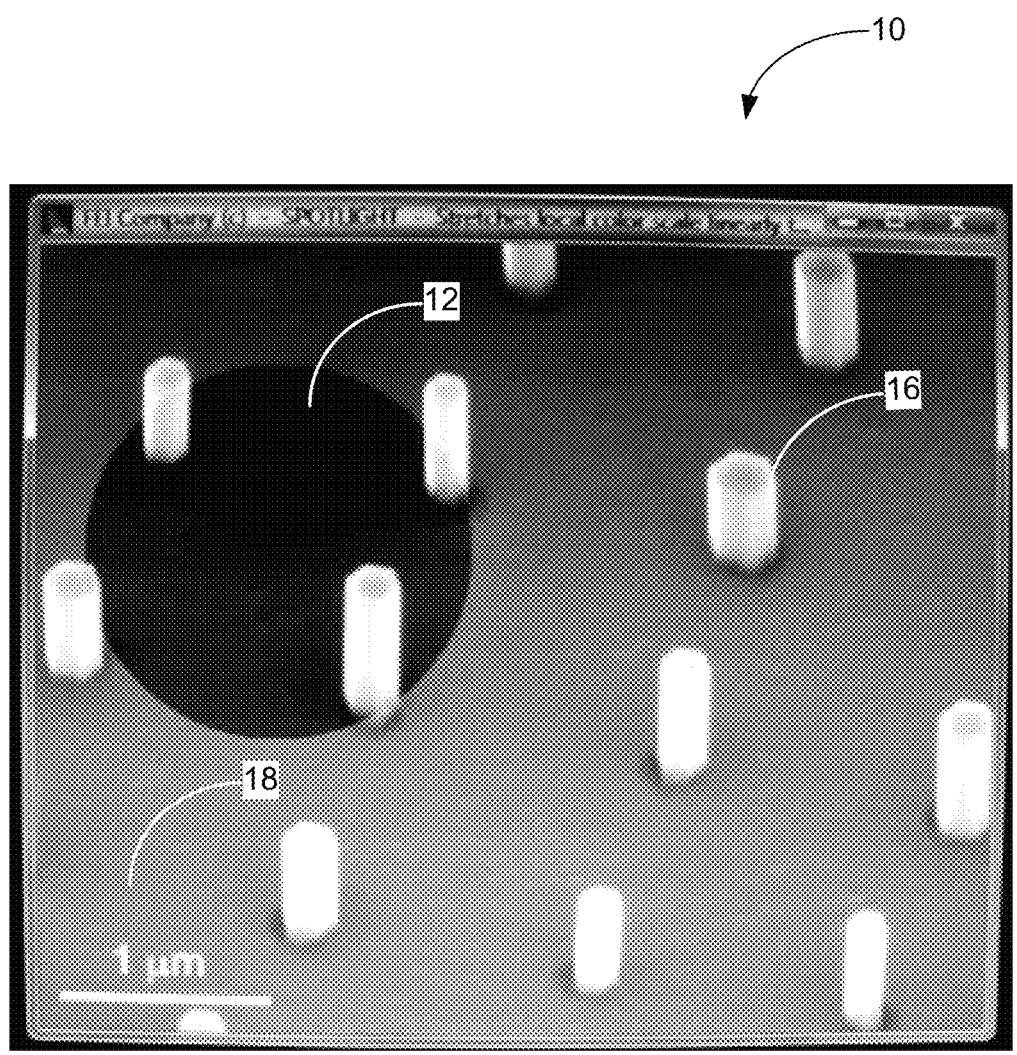
FIG. 1 is a screenshot of a display screen showing a micrograph of white columns on a grey background, with a contrast enhancing spotlight placed over a region of interest that includes columns.

User controllable image enhancement can help a user more fully exploit available image data. For example, as shown in FIGS. 1-9, in a preferred embodiment a display 10 includes a user controlled spotlight 12. As used herein, a "spotlight" is a region (or regions) of the image having a user-controlled position, size and shape within which a real-time action is performed. A preferred user interface allows for dynamic, real-time, easy-to-use, intuitive control, such as a mouse, a multitouch screen, a touch pad, etc. An "action" may comprise one or more of the following: a gray-level conversion, various measurements and/or analyses of the region of interest ("ROI"), or the initiation of a pattern search. Based on the action applied to the ROI other tool-dependent actions may then be initiated. In the image shown on display 10, a set of bright (i.e. intense) columns 16 are shown against a darker gray background 18. In an automatic mode of operation, the spotlight automatically sets the gray shade scale so that it encompasses only the pixel brightness values in the imagery data corresponding to the region shown in spotlight 12. Accordingly, in FIG. 1, with the bright columns and a lighter portion of the background both in the spotlight, the contrast between background and column is enhanced. In FIG. 2, where no portion of the bright columns are in the spotlight 12, a much smaller range of brightness is present in the spotlight 12 than in the image 10 as a whole, the display contrast of the background 18 in the spotlight 12 is greatly enhanced, permitting the user to perceive details that would not otherwise be visible. Thus the image intensity-to-period value translation now has a better "fit" to the original range of image intensities.

Figure 2:
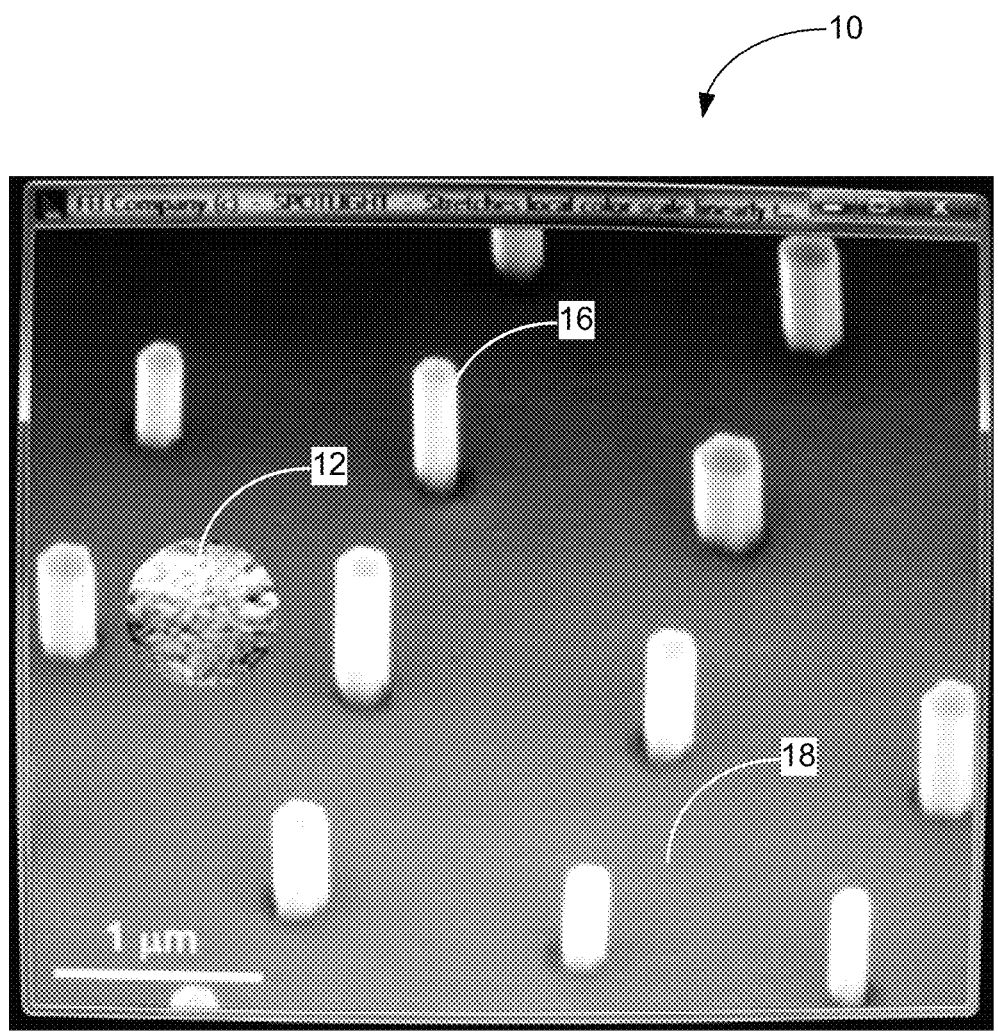
FIG. 2 shows the display screen of FIG. 1 showing the spotlight in a different location, and smaller size, focused exclusively on the gray background.
Figure 3:
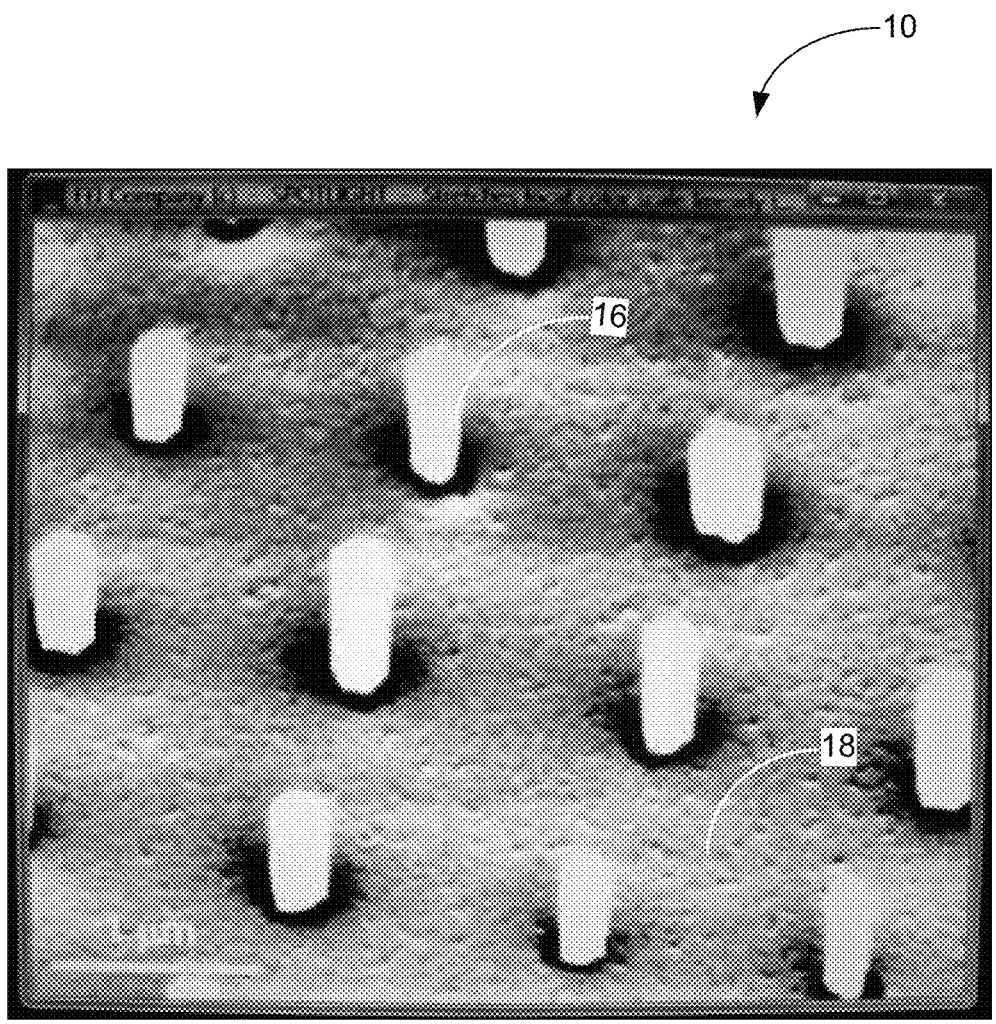
FIG. 3 shows the display screen of FIG. 1, showing the gray scale of the spotlight of FIG. 2, used over the entire display.

Comparing FIG. 1 and FIG. 2, the spotlight size is user controlled, by for example the thumbwheel on a mouse. FIG. 3 shows the application of the gray-shades scale used for the spotlight 12 in FIG. 2, applied, by a user command, to the screen as a whole. This is particularly helpful because in many types of images, such as biological imagery or imagery of integrated circuits, feature types, such as red blood cells or connective pathways, have similar reflectivity of imaging media. Accordingly, a gray scale range which brings out the characteristics of an instance of a feature type may bring out the characteristics of other instances of the same feature type. For example, the gray shade scale that shows the characteristics of one red blood cell, is likely to show the characteristics of other red blood cells in an image. If red blood cells are of interest to the viewer, generalizing the spotlight gray scale, when the spotlight is focused on red blood cells, could be highly beneficial.

Figure 4:
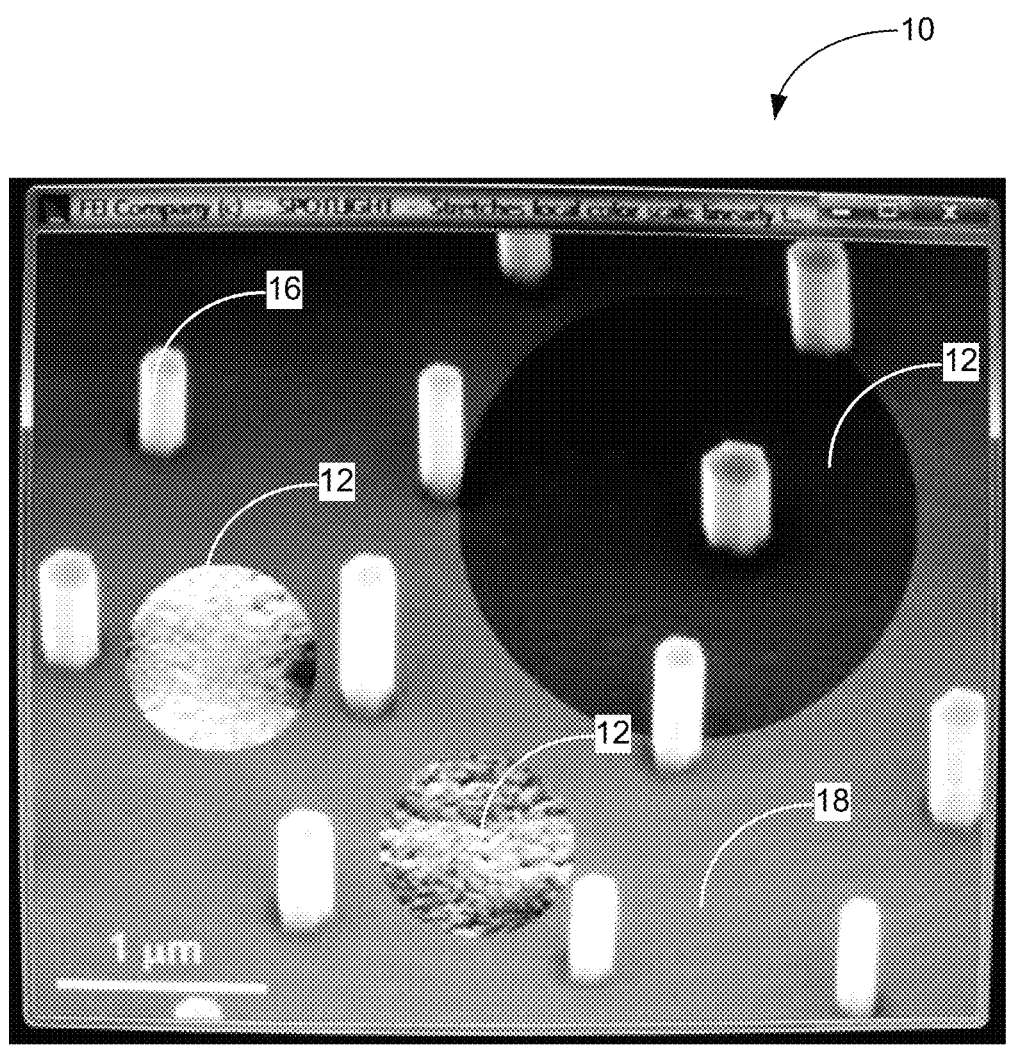
FIG. 4 shows the display of FIG. 1, showing three spotlights of various sizes.
Figure 5:
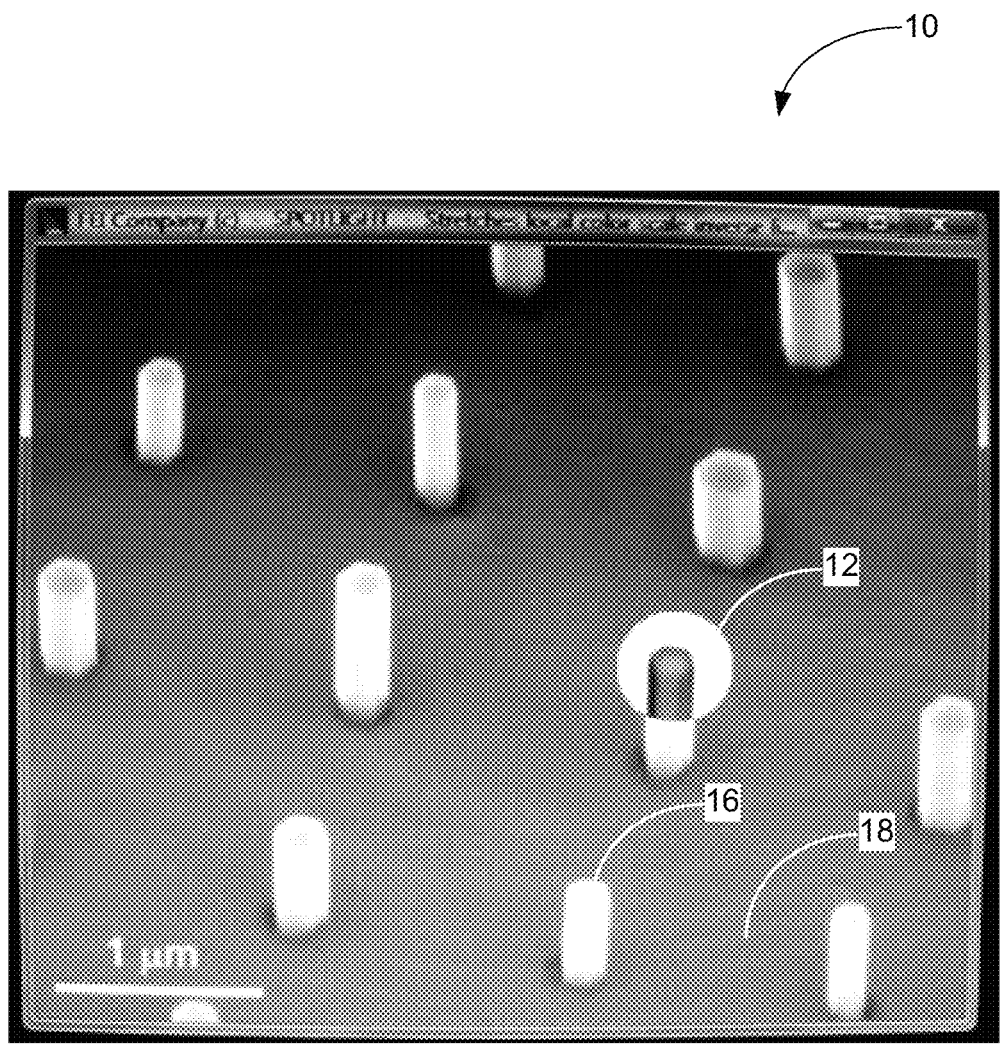
FIG. 5 shows the display of FIG. 1, showing a spotlight in reverse contrast mode.
Figure 6:
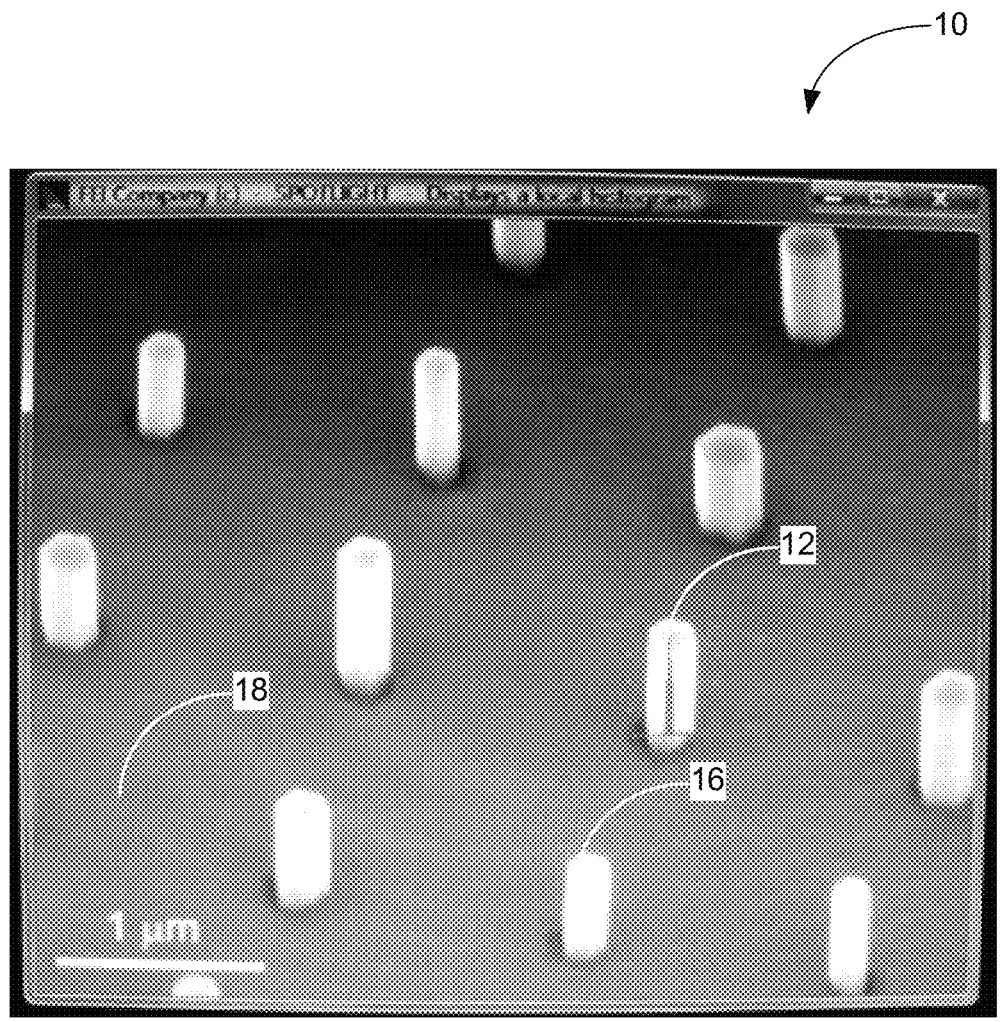
FIG. 6 shows the display of FIG. 1, showing a spotlight in histogram mode.
Figure 7:
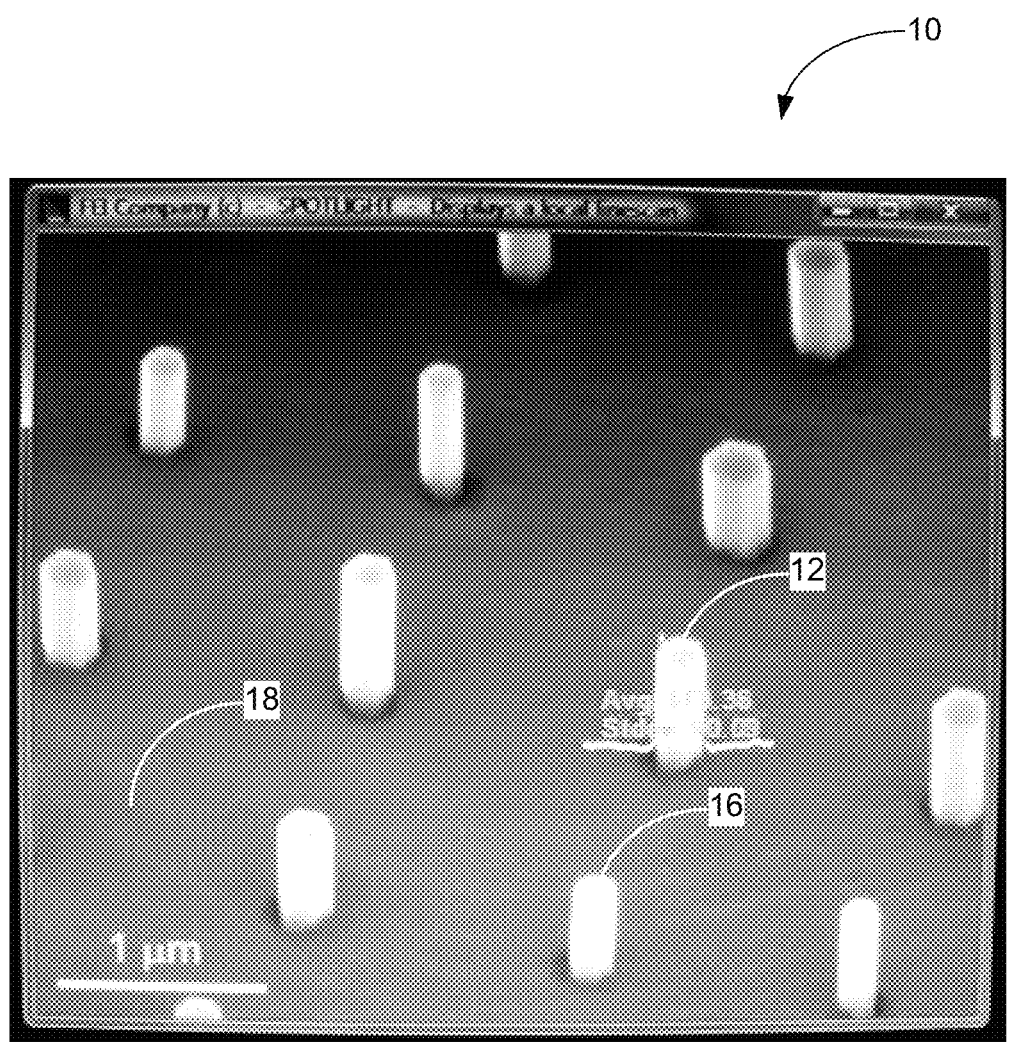
FIG. 7 shows the display of FIG. 1, showing a measurement tool being used to measure a line scan across a column.

FIG. 4, shows the effect of using several different spotlights, by for example, right clicking on a mouse used to convey user input and then moving the cursor to another screen area, and left clicking the mouse to activate an additional spotlight. FIG. 5 illustrates commanding a reverse image in the spotlight. FIG. 6 illustrates presenting a histogram of pixel brightness in the spotlight area. In one preferred embodiment, a user may then select a portion of the histogram's pixel intensity scale, to use as a gray shade scale extent, for the spotlight display. Many other abstraction of pixel information could be presented, such as a histogram of neighboring pixel contrast values. FIG. 7 shows a spotlight tool for finding lines of contrast and measuring the distance between two such lines.

Figure 8:
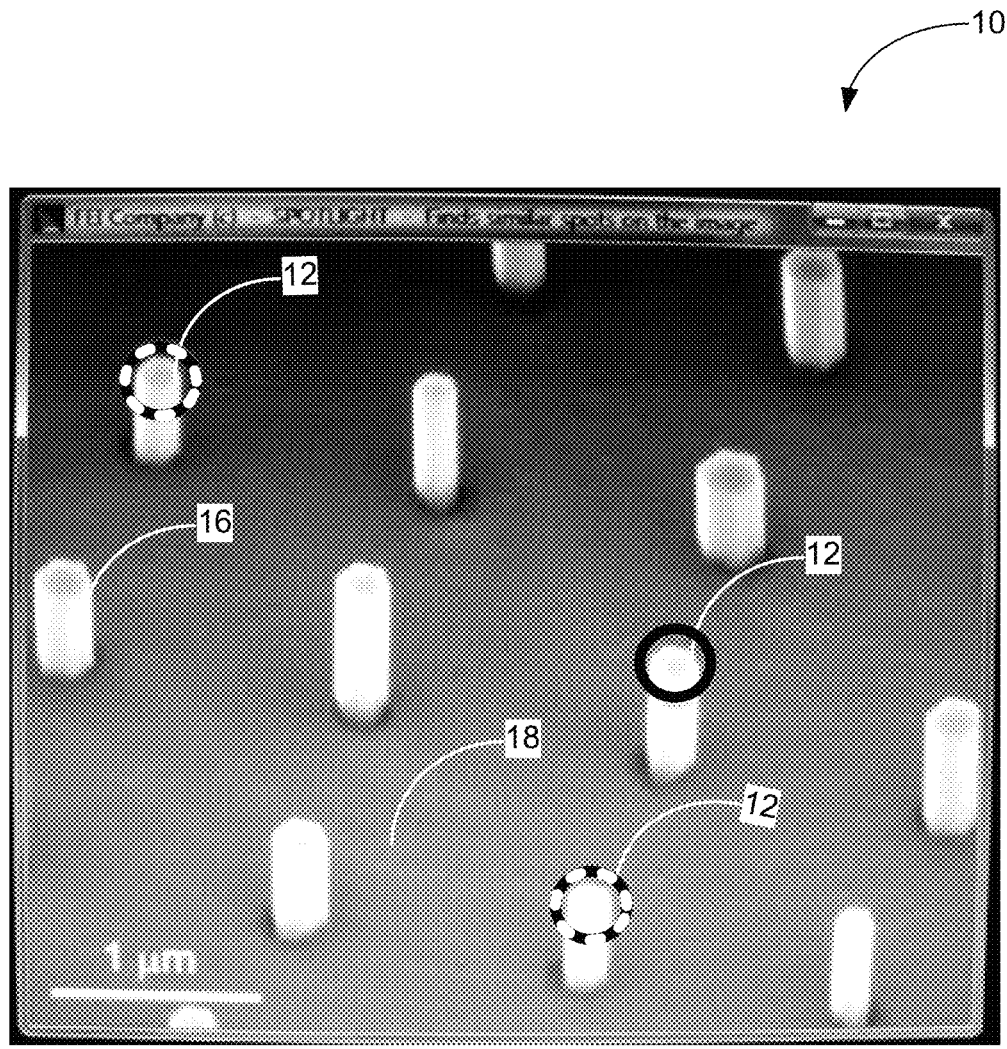
FIG. 8 shows the display of FIG. 1, showing a pattern recognition tool being used to recognize column tops for a particular column types.
Figure 8A:
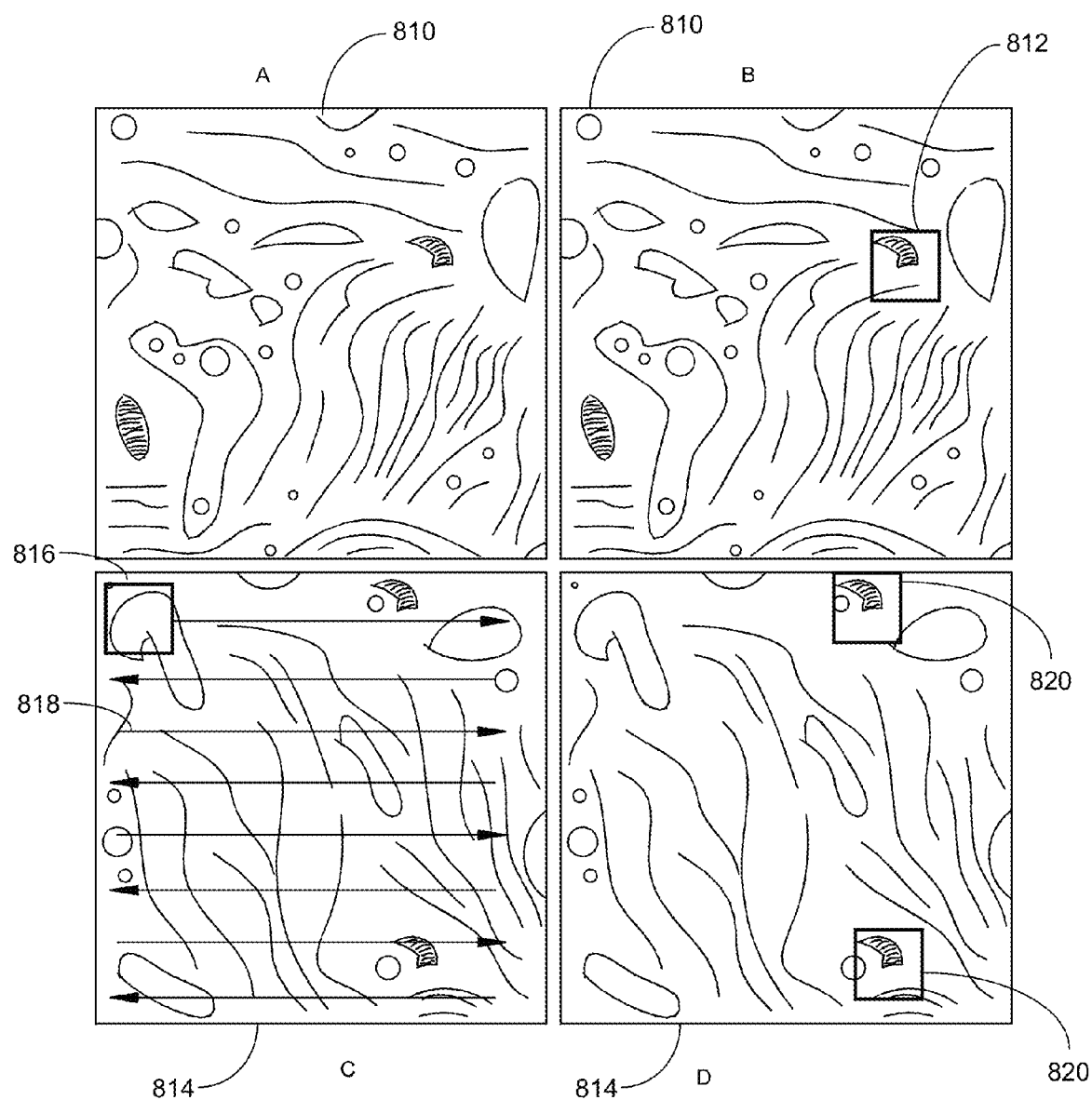
FIG. 8A illustrates the pattern recognition scan used to perform the pattern recognition shown in FIG. 8.

FIG. 8 shows a pattern match feature, designed to find a pattern of high-contrast lines in the spotlight and finding and subsequently highlighting similar patterns elsewhere in the image. FIG. 8A illustrates the automatic feature recognition software, the results of which are shown in FIG. 8. In view (A), a first image 810 has been acquired. View (B) shows a square cursor 812 placed around a Feature of Interest (FoI). The system will then look for recurrences of this FoI, both within the first image, and if commanded to do so, in a number of subsequently acquired images, as shown here in views (C) and (D). In view (C), a second image 814 has been acquired. The system scans a window 816 in a raster pattern across the image as illustrated by the arrows 818. Pixels within this scanned window are then cross-correlated with the pixels within the FoI in view (B) to find the best fit above a predetermined minimum fit criterion. View (D) shows that the second image 814 contained two regions 820, each of which contains a structure sufficiently similar to that in view (B) that the cross-correlation exceeded the minimum threshold. The system then highlights these matching regions, by placing a frame 820 around each one. This procedure can potentially be performed on a semi-automated, or fully-automated, basis to analyze a large number of images for FoIs. Multiple different FoI types could be defined within the first image by the operator, with possibly color-coding of each FoI type (different color frames, for example).

Figure 9:
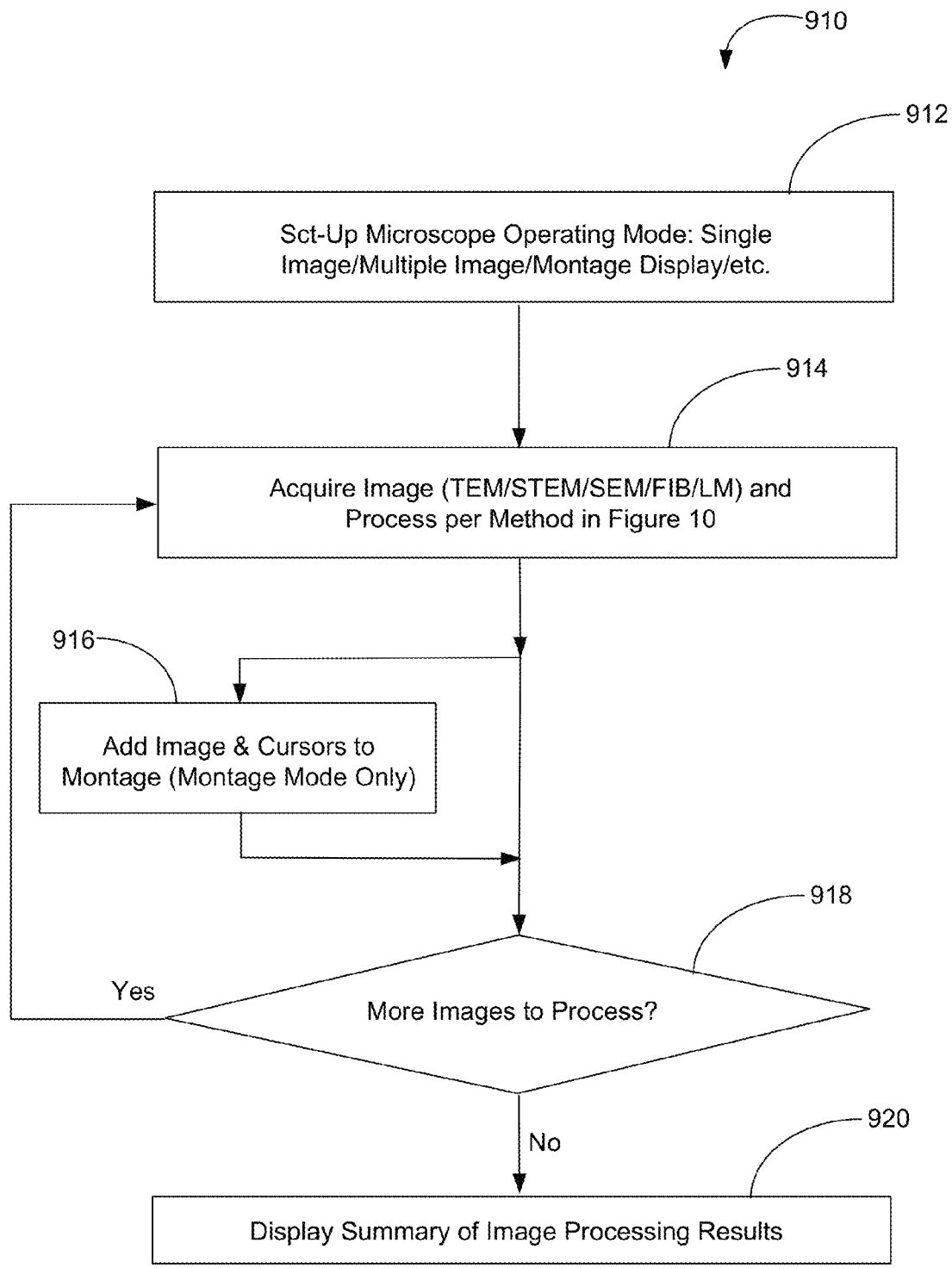
FIG. 9 is a flow chart of steps of using display device of the embodiment shown in FIGS. 1-8.

FIG. 9 is a flowchart of operation 910 of a system that accommodates the functions shown in FIGS. 1-8A. The operator first decides 912 upon an instrument operating mode, e.g., single image acquisition, multiple image acquisition, displaying an image montage (i.e., 2×2, 3×3, etc. arrays of images). Next, the first image is acquired and processed 914 (this step is shown in greater detail in FIG. 10). If a montage is to be displayed, each image is placed into the montage as they are acquired and processed 916. Once all the images have been acquired (decision box 918), a summary of the results of the image processing of all the images is displayed for the operator 920.

Figure 10:
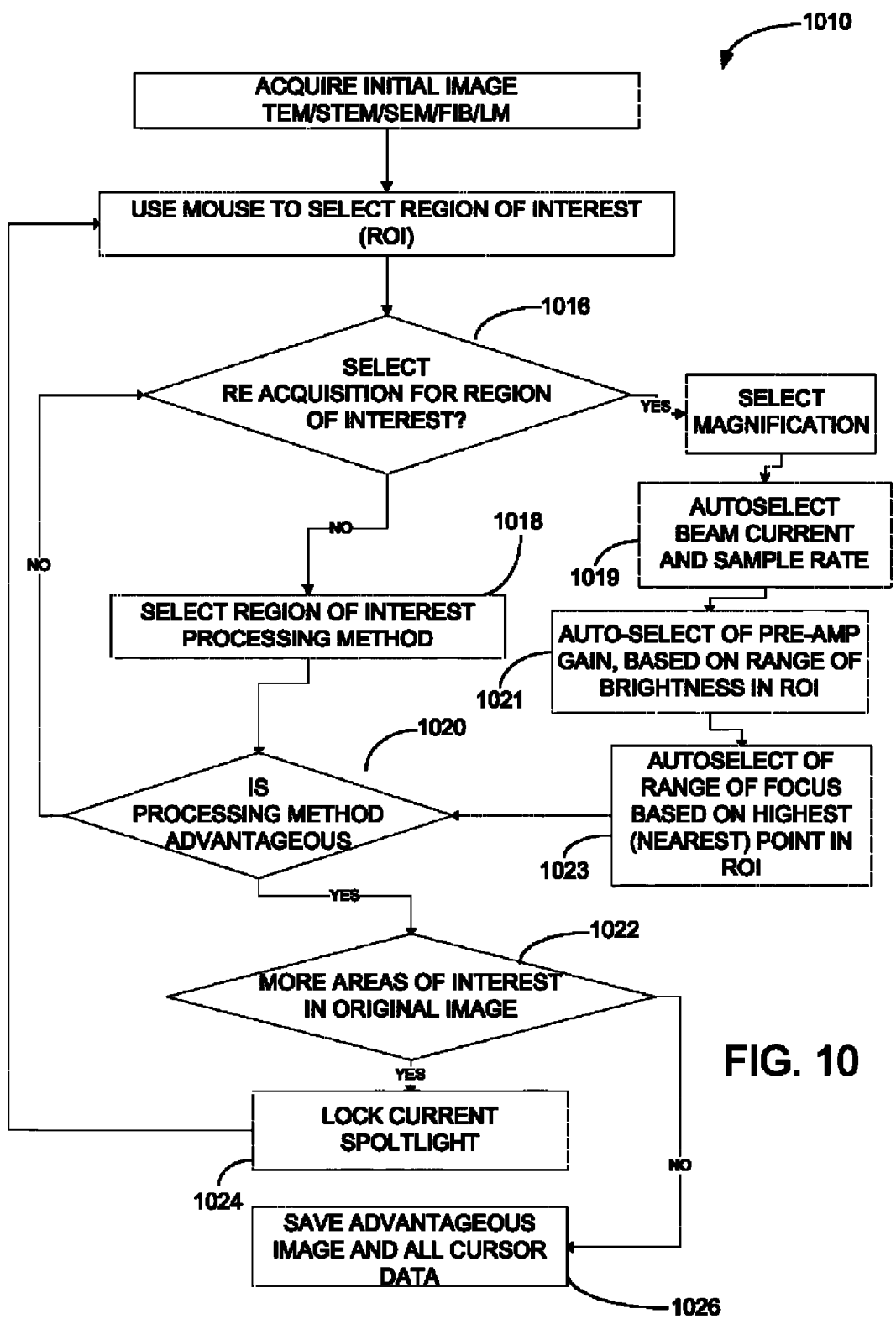
FIG. 10 is a flow chart is a flow chart showing greater detail for one of the steps of the process of FIG. 9.

Referring to FIG. 10, a user implemented sequence of operations 1010 is shown. In step 1012, the user acquires an image. As noted in the figure, the image may be either from a transmission electron microscope, scanning transmission electron microscope, scanning electron microscope, focused ion beam or a light microscope. In step 1014 the user moves the cursor to a region of interest on the image that he would like to inspect more closely. The user then chooses whether to reacquire the region of interest, or simply display the data already collected for that region, but with a different local image processing than used for the image already being displayed. If no reacquisition is chosen a local image processing method is chosen (step 1018). If reacquisition is chosen, a different magnification can be selected 1017. In this case, the system auto-selects a new beam current and sample rate 1019 (for scanning devices). In all cases the pre-amp gain is set 1021 based on the range of brightness (reflectivity) in the ROI, and the range of focus is set 1023, based on the highest point in the ROI.

If the method chosen is not advantageous (decision step 1020) the user picks another imaging method in decision block 1016. In decision step 1022, if the method evaluated in step 1020 is advantageous, the user moves the cursor to another region of interest, while maintaining the spotlight(s) already created (step 1024). If none are found (decision step 1022) all advantageous imagery and associated information is saved (step 1026).

Although as noted above, displaying available data in an advantageous manner can yield beneficial results, in a further embodiment the spotlight user controls are manipulated to command further imagery data collection in the spotlight area. This can be beneficial in at least three different ways.

First, if additional imaging in the spotlight area is performed, and if the beam was not already at maximum sharpness for the original frame and/or the sampling rate was not at the maximum, the beam (ion or electron) can be sharpened and/or the pixel sampling rate can be increased to gain a finer resolution of the spotlight region. Even if greater resolution is not possible, the spotlight region can be expanded and shown at a greater magnification, which could help a viewer spot a subtle feature.

Figure 11:
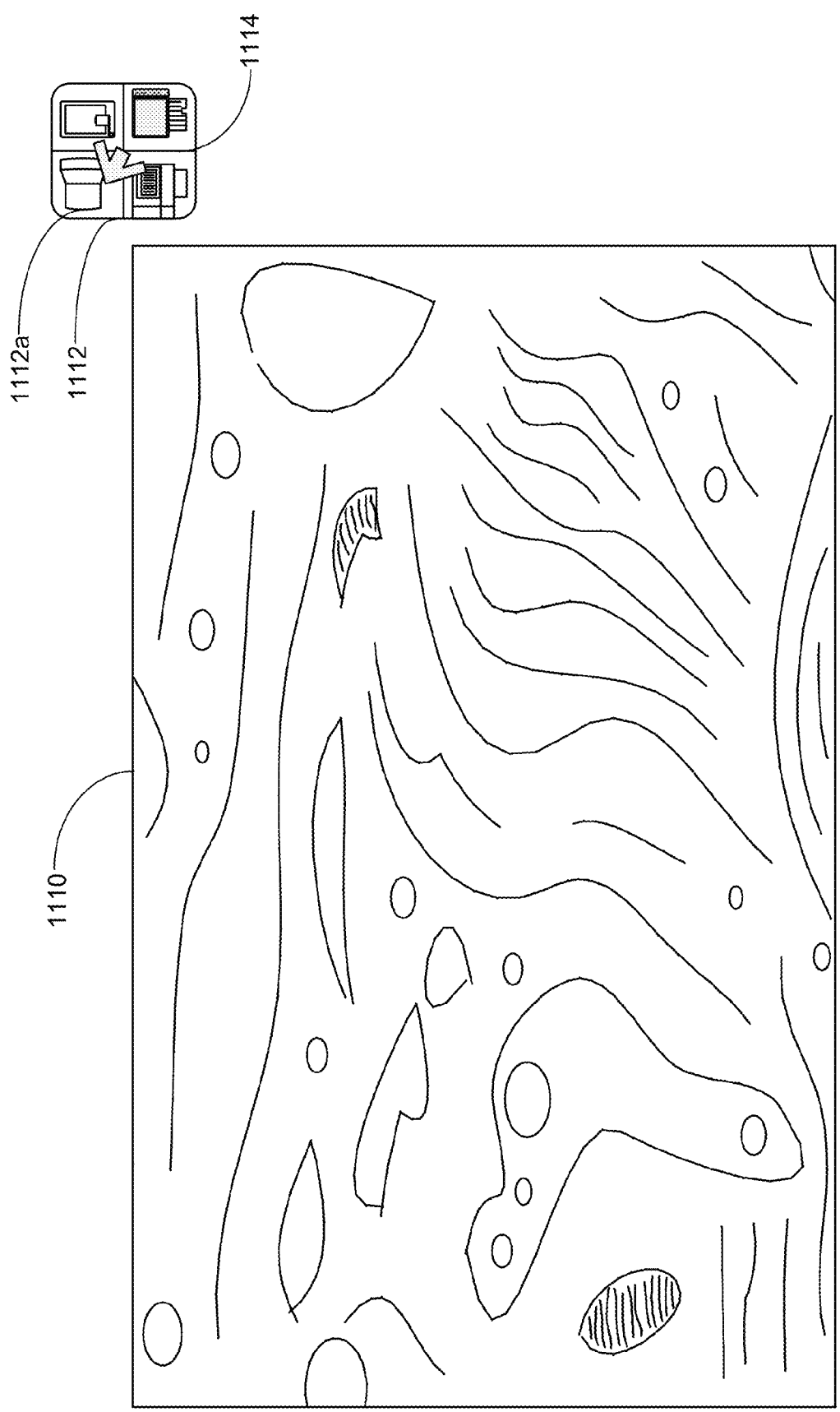
FIG. 11 is a representation of a display, having an icon bar for selection of varying types of spotlight imaging.
Figure 12:
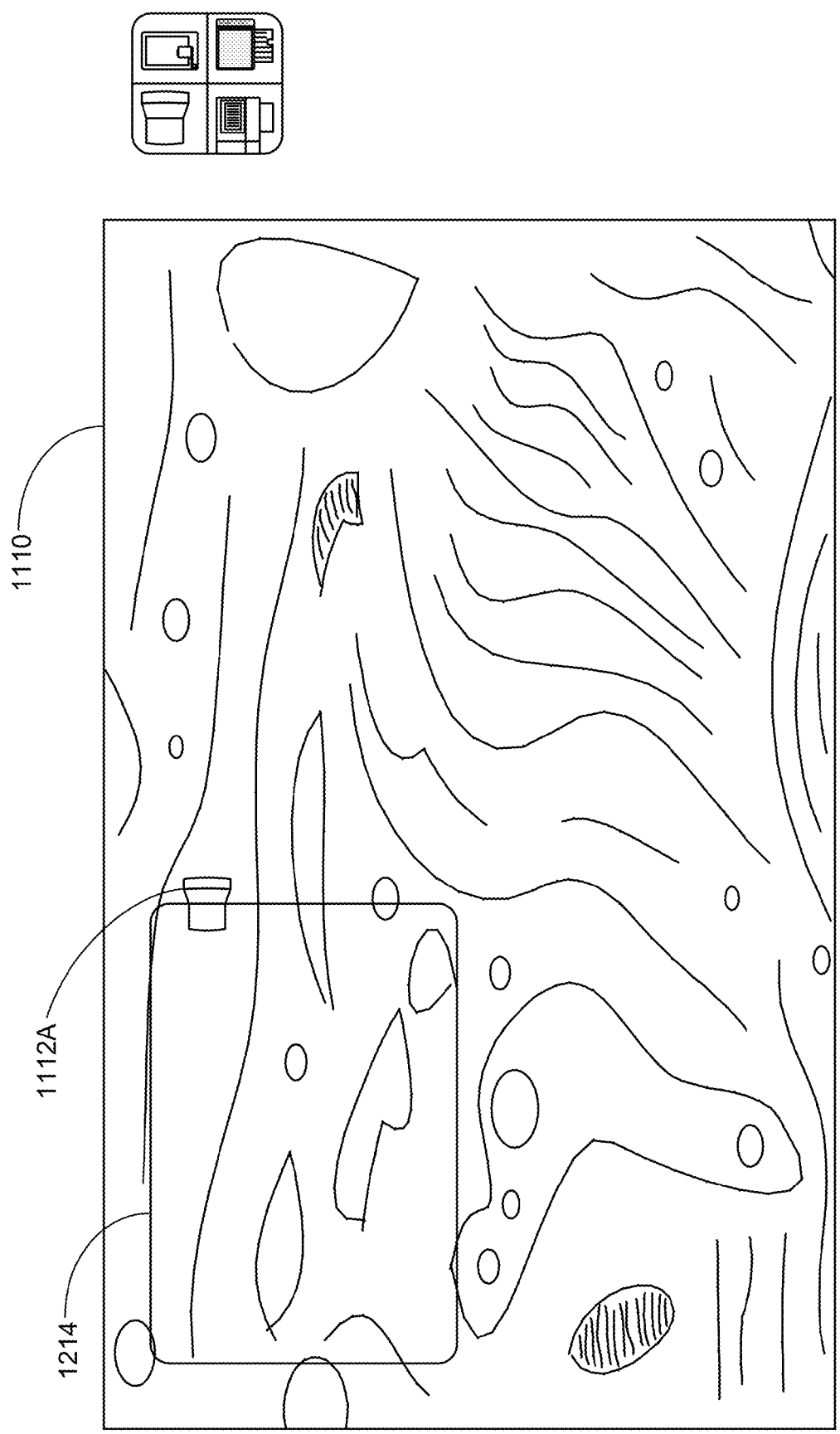
FIG. 12 is a representation of the display of FIG. 11, showing a selected spotlight.
Figure 13:
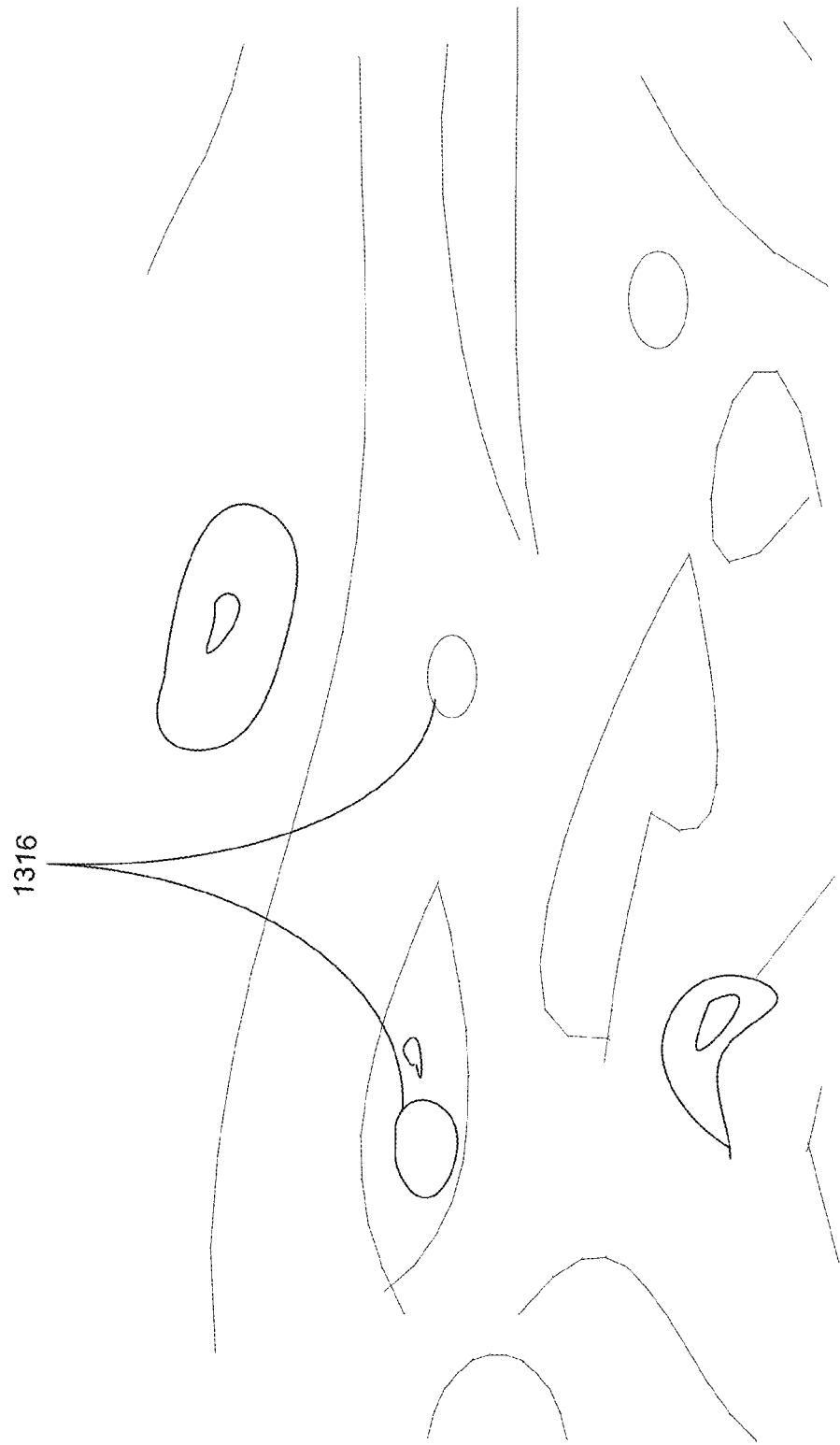
FIG. 13 shows a representation of the spotlight region of FIG. 12, increased in size and resolution.
Figure 14:
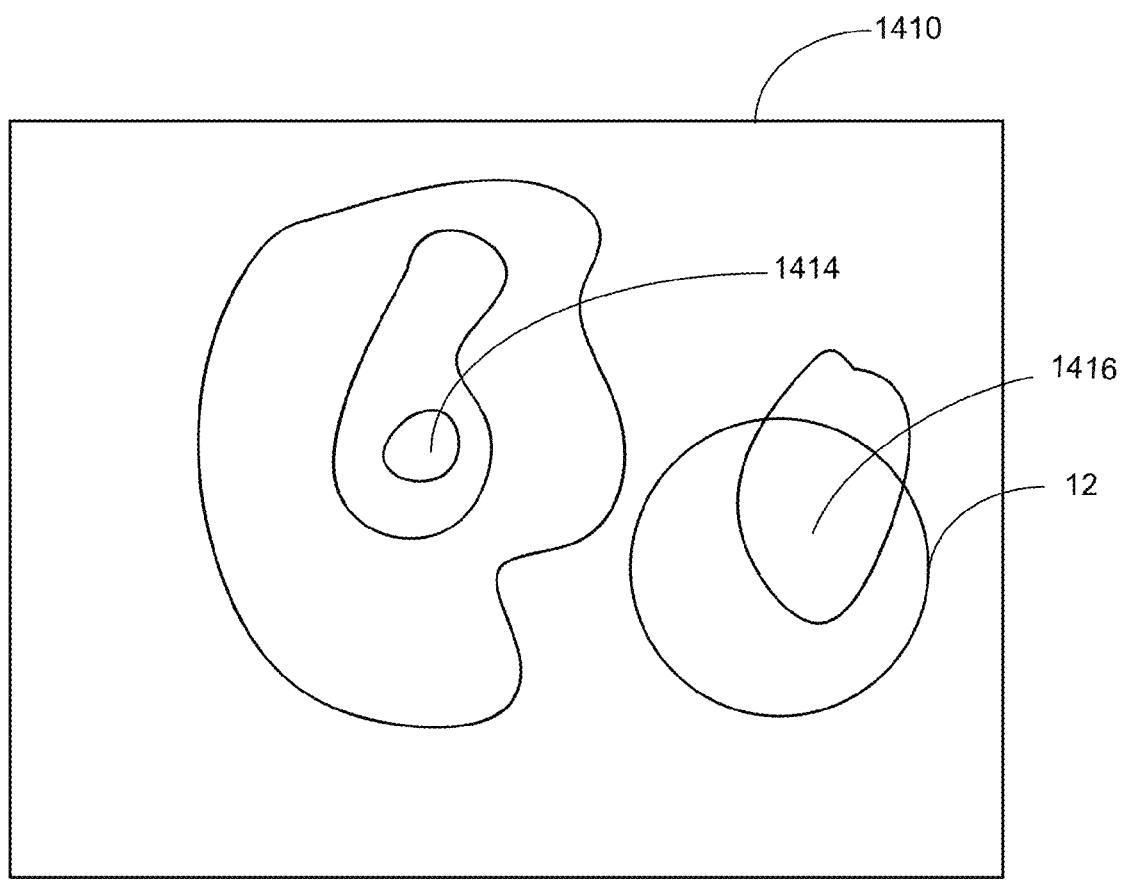
FIG. 14 shows a topographic representation of an imaged area, to illustrate focus adjustment.

FIG. 11 shows a display 1110 permitting user selection of a rectangular reimaging spotlight, through the use of a set of icons 1112 displayed at the side of the screen. The icon 1112a for re-imaging magnification is being chosen, by use of cursor 1114. FIG. 12 shows the rectangular spotlight 1214 selected by a user and marked by icon 1112a, on display 1110. FIG. 13 shows the spotlight image enlarged and with some further details 1316 now visible, due to higher resolution Also, as illustrated in FIG. 14, for a new spotlight frame, the height of the focal plane can be optimized for the spotlight area 12, as opposed to the frame as a whole. FIG. 14 is a topographical representation 1410 of an area being imaged. The focus is typically set right at the highest altitude feature (closest range to device, 1414 for the frame 1410), potentially causing some further range features to be somewhat out of focus. If the highest altitude feature 1416 in the spotlight area 12, is not as high as 1414, the focus can be shifted to the range to that feature 1416, thereby bringing the spotlight area 1412 into a tighter focus.

Figure 15:
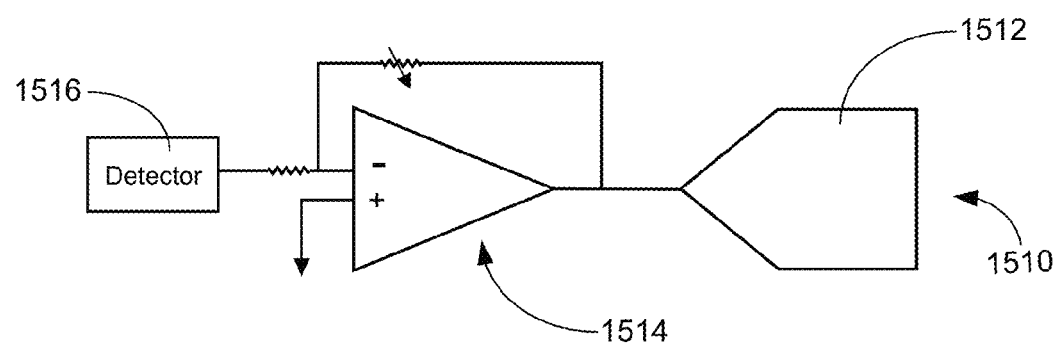
FIG. 15 shows a sampling circuit having an adjustable pre-amp gain.

Referring to FIG. 15, which shows a schematic diagram for a digital sampling circuit 1510, the Analog to Digital (A/D) 1512 sampling range can be modified, by adjusting the preamp 1514, so that the brightness range translated to voltage range by detector 1516 is sampled with greater specificity, in the spotlight 12 (FIGS. 1-8). To have new imagery taken with an adjusted preamp, icon 1112b is selected from icon bar 1112 in FIG. 11. In one preferred embodiment, any time new imagery is acquired the pre-amp is adjusted for the brightness encountered.

Figure 16:
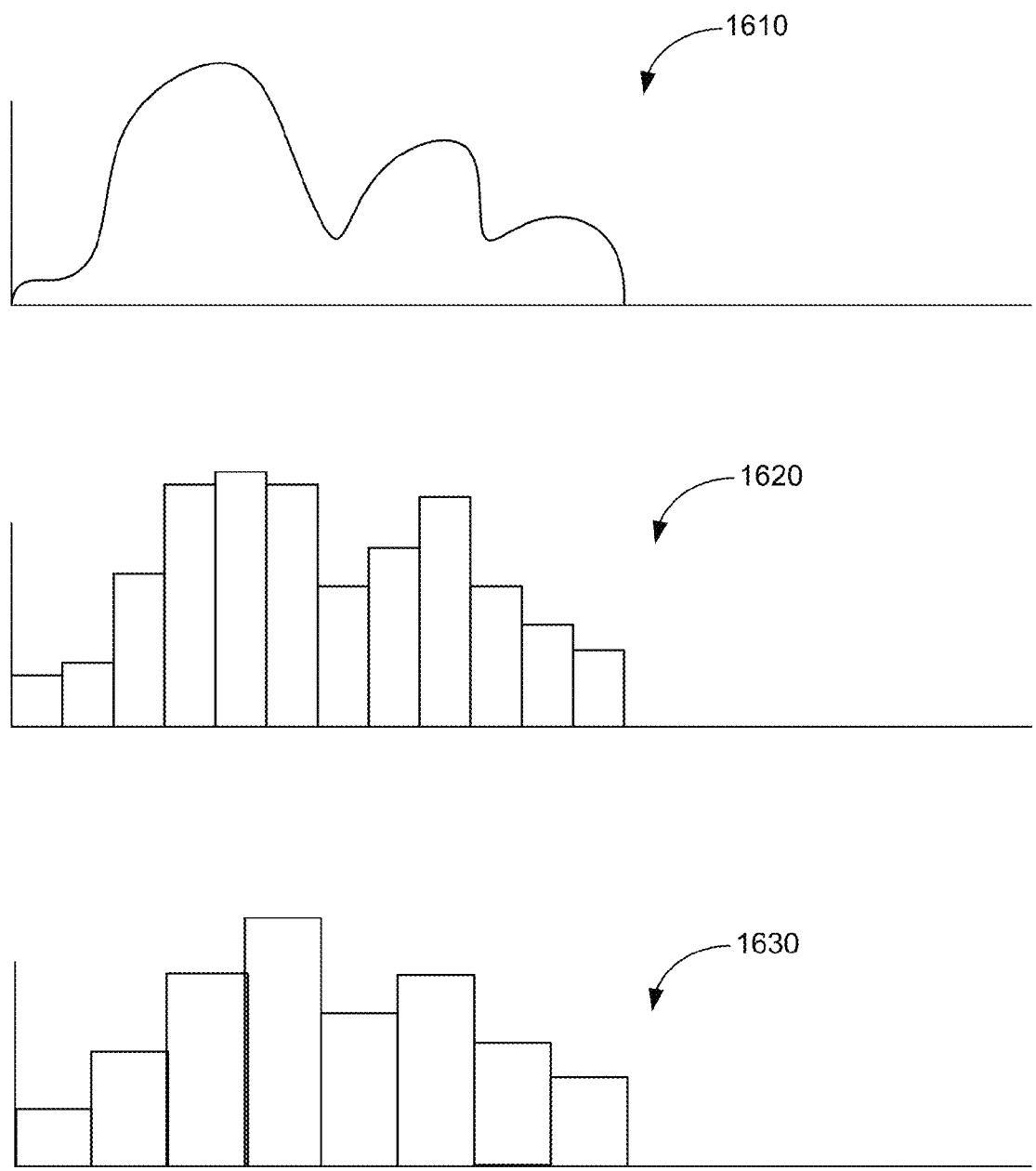
FIG. 16 is a series of graphs, showing how pixel brightness information may be lost during analog-to-digital sampling followed by translation of digital pixel values to display pixel intensities.

To illustrate the potential loss of information through A/D sampling and then digital pixel value to display pixel intensity translation, through a gray shade scale, FIG. 16 shows a density function 1610 of natural brightness values over a region being imaged. Graph 1620 shows the effect of A/D sampling (for an A/D convertor having a very low number of output bits, for ease of presentation), in which each pixel area having a brightness falling within a particular range is translated to the same digital pixel value. Finally graph 1630 shows the effect of translating digital pixel values to display intensity by way of gray shade scale (again having very few output values, for ease of presentation). In some instances, pixel intensity values that are different are assigned the same display intensity, representing a further loss of information, and thereby clarity to the viewer. In each case, if the range of input values the conversion mechanism must accept is reduced, then a finer set of graph bars could be used, resulting in a finer and more sensitive translation.

Figure 17:
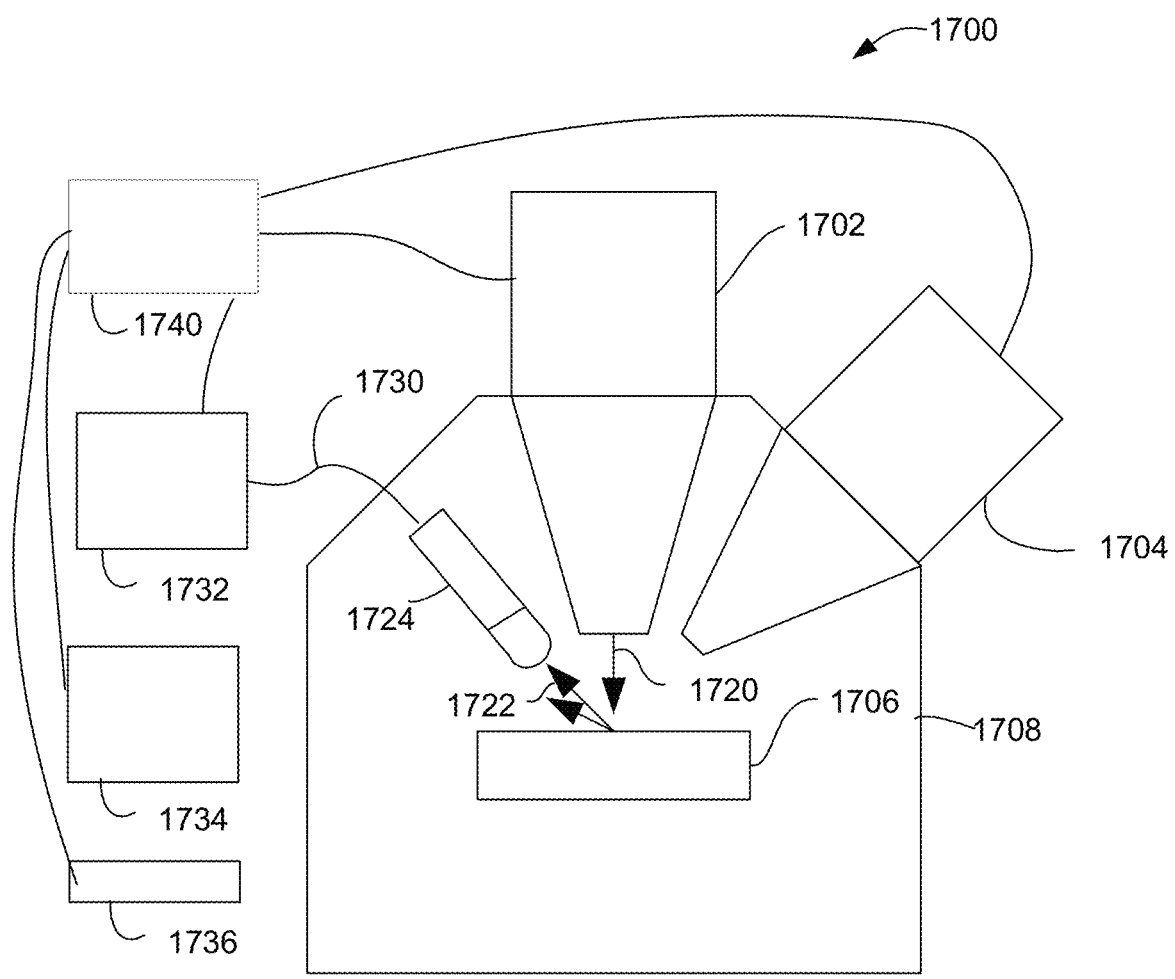
FIG. 17 shows schematically a typical dual beam system that can be used to implement some embodiments of the invention.

FIG. 17 shows schematically a typical dual beam system 1700 having an imaging device, such as scanning electron microscope column 1702 and a focused ion beam column 1704 for operating on a sample 1706 in a vacuum chamber 1708. When primary electron beam 1720 impacts sample 1706, secondary electrons 1722 are detected by a secondary electron detector 1724. The secondary electron current is processed by an image processor 1732 to form an image on display 1734. An input device, such as a keyboard 1736 allow a user to input control commands to a controller 1740 that controls the operation of dual beam system 1700. The controller responds to input commands from the user as described above to position the spotlight on an image on display device 1734 and then to perform operations determined by the user. The operations including, for example, altering the properties of the image within the spotlight region; addressing the imaging device to acquire a new image, using different imaging parameters, of the region of the sample corresponding to the spotlight region of the image; applying to the entire image properties of the spotlight portion of the image; and reacquiring an image of the sample using parameters previously used to acquire the image of the spotlighted portion.

In accordance with some embodiments of the present invention, an imaging assembly comprises an imaging device for performing an imaging process, over an original image frame, that translates image intensity to digital pixel value to create a set of digital pixels; a display device having a display screen for displaying an image, a display data processor, and user controls, permitting a user to position a spotlight on the display screen, thereby defining a spotlight region, and to select one or more user commands, from a set of predefined user commands, related to image data in the spotlight region;

and the imaging assembly alters the spotlight region display in response to the user command.

In some embodiments, a predefined user command causes the gray-shade scale to change in the spotlight region. In some embodiments, the predefined user command is utilized; an additional predefined user command causes the gray-shade scale of the spotlight region to be generalized to the original image frame. In some embodiments, a predefined user command causes the spotlight region to be shown in reverse-contrast.

In some embodiments, a predefined user command causes the display data processor to search for and highlight on the display device other areas of the original image frame that have a similar arrangement of pixels to the spotlight region. In some embodiments, a predefined user command causes a measurement to be made of a feature in the spotlight. In some embodiments, the user controls comprise a mouse or a touch screen.

In some embodiments, a predefined user command causes the imaging device to re-image the spotlight region. In some embodiments, when the imaging device re-images the spotlight area it uses an image intensity-to-pixel value translation that better fits the range of image intensity found in the originally imaged spotlight area. In some embodiments, the imaging device includes a range of focus adjustment and that when the imaging device re-images the spotlight area it adjusts the range of focus to match the nearest range element of the spotlight region, if it is nearer to the imaging device than the nearest range element of the original image frame.

In some embodiments, the imaging device utilizes a scanning beam, and if the scanning beam used to image the original frame was not the finest beam possible, then a finer beam is used for the re-imaging of the spotlight region. In some embodiments, the imaging device utilizes a scanning beam and samples the return from the scanning beam, and if the sampling rate per unit scan length used to image the original frame was not the highest possible, then a faster sampling rate is used for the re-imaging of the spotlight region.

In some embodiments, the imaging device is a scanning electron microscope. In some embodiments, the imaging device is a transmission electron microscope. In some embodiments, the imaging device is a focused ion beam microscope. In some embodiments, the imaging device is a small dual beam microscope. In some embodiments, the imaging device is a digital light microscope.

In accordance with some embodiments of the present invention, an image display assembly comprises an image display device, having a display screen and display data processing assembly controlling the display screen, and user controls, which permit a user to place a spotlight on the display screen causing the image to be displayed differently in the spotlight than outside the spotlight and permit a user to cause the manner in which the image is displayed outside the spotlight to change to become the same as the manner in which the image is displayed in the spotlight, connected to said display data processing assembly.

In some embodiments, the image is displayed differently in the spotlight by changing the scale by which digital pixel values are translated to display pixel intensities to better fit the range of digital pixel values in the spotlight region.

In accordance with some embodiments of the present invention, an image display assembly comprises an image display device, having a display screen and display data processing assembly controlling the display screen, and user controls, which permit a user to place spotlight on the display screen and to cause an algorithm to be executed that detects a pattern in the spotlight and highlights similar patterns appearing outside the spotlight, connected to said display data processing assembly.

In accordance with some embodiments of the present invention, an image formation and display assembly comprises a digital image formation device that includes an analog-to-digital convertor for converting an analog electrical signal into a digital electrical signal, thereby forming a set of pixels; an image display device, adapted to receive the pixels from the image formation device and having a display screen and display data processing assembly controlling the display screen, whereby the display screen may display a first image; and user controls, which permit a user to place a spotlight on the display screen and to cause the digital image formation device to reimage the region corresponding to the spotlight area and the image display device to display said reimaged spotlight region, connected to said display data processing assembly.

In some embodiments, the digital image formation device re-images the spotlight area using an image intensity-to-pixel value translation that better fits the range of image intensity found in the originally imaged spotlight area. In some embodiments, the digital image formation device includes a range of focus adjustment and that when the digital image formation device re-images the spotlight area the digital image formation device adjusts the range of focus to match the nearest range element of the spotlight region if it is nearer to the digital image formation device than the nearest range element of the original image frame.

In some embodiments, the digital image formation device utilizes a scanning beam, and if the scanning beam used to image the original frame was not the finest beam possible, then a finer beam is used for the re-imaging of the spotlight region. In some embodiments, the digital image formation device utilizes a scanning beam and samples the return from the scanning beam, and if the sampling rate per unit scan length used to image the original frame was not the highest possible, then a faster sampling rate is used for the re-imaging of the spotlight region.

The invention described herein has broad applicability and can provide many benefits as described and shown in the examples above. The embodiments will vary greatly depending upon the specific application, and not every embodiment will provide all of the benefits and meet all of the objectives that are achievable by the invention. Particle beam systems suitable for carrying out the present invention are commercially available, for example, from FEI Company, the assignee of the present application. The accompanying drawings are intended to aid in understanding the present invention and, unless otherwise indicated, are not drawn to scale.

It should be recognized that both a method of performing the steps and processes described above and an apparatus performing the operation of such a method would be within the scope of the present invention. Further, it should be recognized that embodiments of the present invention can be implemented via computer hardware, a combination of both hardware and software, or by computer instructions stored in a non-transitory computer-readable memory. The methods can be implemented in computer programs using standard programming techniques—including a non-transitory computer-readable storage medium configured with a computer program, where the storage medium so configured causes a computer to operate in a specific and predefined manner—according to the methods and figures described in this Specification. Each program may be implemented in a high level procedural or object oriented programming language to communicate with a computer system. However, the programs can be implemented in assembly or machine language, if desired. In any case, the language can be a compiled or interpreted language. Moreover, the program can run on dedicated integrated circuits programmed for that purpose.

Further, methodologies may be implemented in any type of computing platform, including but not limited to, personal computers, mini-computers, main-frames, workstations, networked or distributed computing environments, computer platforms separate, integral to, or in communication with charged particle tools or other imaging devices, and the like. Aspects of the present invention may be implemented in machine readable code stored on a storage medium or device, whether removable or integral to the computing platform, such as a hard disc, optical read and/or write storage mediums, RAM, ROM, and the like, so that it is readable by a programmable computer, for configuring and operating the computer when the storage media or device is read by the computer to perform the procedures described herein. Moreover, machine-readable code, or portions thereof, may be transmitted over a wired or wireless network. The invention described herein includes these and other various types of computer-readable storage media when such media contain instructions or programs for implementing the steps described above in conjunction with a microprocessor or other data processor. The invention also includes the computer itself when programmed according to the methods and techniques described herein.

Computer programs can be applied to input data to perform the functions described herein and thereby transform the input data to generate output data. The output information is applied to one or more output devices such as a display monitor. In preferred embodiments of the present invention, the transformed data represents physical and tangible objects, including producing a particular visual depiction of the physical and tangible objects on a display. Preferred embodiments of the present invention also make use of a particle beam apparatus, such as a FIB or SEM, in order to image a sample using a beam of particles. Such particles used to image a sample inherently interact with the sample resulting in some degree of physical transformation. Further, throughout the present specification, discussions utilizing terms such as "calculating," "determining," "measuring," "generating," "detecting," "forming," "controlling" or the like, also refer to the action and processes of a computer system, or similar electronic device, that manipulates and transforms data represented as physical quantities within the computer system into other data similarly represented as physical quantities within the computer system or other information storage, transmission or display devices.

To the extent that any term is not specially defined in this specification, the intent is that the term is to be given its plain and ordinary meaning. Whenever the terms "automatic," "automated," or similar terms are used herein, those terms will be understood to include manual initiation of the automatic or automated process or step. In the previous discussion and in the claims, the terms "including" and "comprising" are used in an open-ended fashion, and thus should be interpreted to mean "including, but not limited to . . . . " The term "integrated circuit" refers to a set of electronic components and their interconnections (internal electrical circuit elements, collectively) that are patterned on the surface of a microchip. The term "semiconductor device" refers generically to an integrated circuit (IC), which may be integral to a semiconductor wafer, singulated from a wafer, or packaged for use on a circuit board. The term "FIB" or "focused ion beam" is used herein to refer to any collimated ion beam, including a beam focused by ion optics and shaped ion beams.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follows:

1. An imaging assembly, comprising:
    an imaging device for performing an imaging process, over an original image frame, that translates image intensity to digital pixel value to create a set of digital pixels;
    a display device having a display screen for displaying an image, a display data processor, and user controls, permitting a user to position a spotlight on the display screen, thereby defining a spotlight region, and to select one or more user commands, from a set of predefined user commands, related to image data in the spotlight region; and
    wherein the imaging assembly alters the spotlight region display, in response to a predetermined user command, which causes the display data processor to search for and highlight on the display device, other areas of the original image frame that have a similar arrangement of pixels to the spotlight region.

2. The imaging assembly of claim 1, wherein a predefined user command causes the gray-shade scale to change, in the spotlight region.

3. The imaging assembly of claim 2, wherein the predefined user command is utilized, an additional predefined user command causes the gray-shade scale of the spotlight region to be generalized to the original image frame.

4. The imaging assembly of claim 1, wherein a predefined user command causes the spotlight region to be shown in reverse-contrast.

5. The imaging assembly of claim 1, wherein a predefined user command causes a measurement to be made of a feature in the spotlight.

6. The imaging assembly of claim 1, wherein a predefined user command causes the imaging device to re-image the spotlight region.

7. The imaging assembly of claim 1, wherein the user controls comprise a mouse or a touch screen.

8. The imaging assembly of claim 6, wherein when the imaging device re-images the spotlight area it uses an image intensity-to-pixel value translation that better fits the range of image intensity found in the originally imaged spotlight area.

9. The imaging assembly of claim 6, wherein the imaging device includes a range of focus adjustment and that when the imaging device re-images the spotlight area it adjusts the range of focus to match the nearest range element of the spotlight region, if it is nearer to the imaging device than the nearest range element of the original image frame.

10. The imaging assembly of claim 6, wherein the imaging device utilizes a scanning beam, and wherein if the scanning beam used to image the original frame was not the finest beam possible, then a finer beam is used for the re-imaging of the spotlight region.

11. The imaging assembly of claim 6, wherein the imaging device utilizes a scanning beam and samples the return from the scanning beam, and wherein if the sampling rate per unit scan length used to image the original frame was not the highest possible, then a faster sampling rate is used for the re-imaging of the spotlight region.

12. The imaging assembly of claim 1, wherein said imaging device is a scanning electron microscope.

13. The imaging assembly of claim 1, wherein said imaging device is a transmission electron microscope.

14. The imaging assembly of claim 1, wherein said imaging device is a focused ion beam microscope.

15. The imaging assembly of claim 1, wherein said imaging device is a small dual beam microscope.

16. The imaging assembly of claim 1, wherein said imaging device is a digital light microscope.

17. An image display assembly, comprising:
an image display device, having a display screen for displaying an image and display data processing assembly, controlling the display screen;
user controls connected to said display data processing assembly;
wherein the user controls permit a user to place a spotlight on the display screen, causing the image to be displayed differently in the spotlight than outside the spotlight; and
wherein the user controls permit a search over the image to locate a pattern similar to a pattern within the spotlight and further permit a user to cause the manner in which the image is displayed outside the spotlight to change to become the same as the manner in which the image is displayed in the spotlight.

18. The image display device of claim 17, wherein the image is displayed differently in the spotlight by changing the scale by which digital pixel values are translated to display pixel intensities, to better fit the range of digital pixel values in the spotlight region.

19. An image display assembly, comprising:
an image display device, having a display screen and display data processing assembly controlling the display screen;
user controls connected to said display data processing assembly; and
wherein the user controls permit a user to place a spotlight on the display screen, and to cause an algorithm to be executed that detects a pattern in the spotlight and highlights similar patterns appearing outside the spotlight.

20. An image formation and display assembly, comprising:
a digital image formation device that includes an analog-to-digital convertor for converting an analog electrical signal into a digital electrical signal, thereby forming a set of pixels;
an image display device, adapted to receive the pixels from the image formation device and having a display screen and display data processing assembly controlling the display screen, whereby the display screen may display a first image;
user controls connected to said display data processing assembly; and
wherein the user controls permit a user to place a spotlight on the display screen defining an area having a pattern, the display data processing assembly permitting the initiation of a search over the image to locate a pattern similar to the pattern within the spotlight, and to cause the digital image formation device to reimage the region corresponding to the spotlight area and the image display device to display said reimaged spotlight region.

21. The imaging assembly of claim 20, wherein, when the digital image formation device re-images the spotlight area, the digital image formation device uses an image intensity-to-pixel value translation that better fits the range of image intensity found in the originally imaged spotlight area.

22. The imaging assembly of claim 20, wherein the digital image formation device includes a range of focus adjustment and that when the digital image formation device re-images the spotlight area the digital image formation device adjusts the range of focus to match the nearest range element of the spotlight region, if it is nearer to the digital image formation device than the nearest range element of the original image frame.

23. The imaging assembly of claim 20, wherein the digital image formation device utilizes a scanning beam, and wherein if the scanning beam used to image the original frame was not the finest beam possible, then a finer beam is used for the re-imaging of the spotlight region.

24. The imaging assembly of claim 20, wherein the digital image formation device utilizes a scanning beam and samples the return from the scanning beam, and wherein if the sampling rate per unit scan length used to image the original frame was not the highest possible, then a faster sampling rate is used for the re-imaging of the spotlight region.

\* \* \* \* \*